(12) United States Patent
Oshima et al.

(10) Patent No.: US 10,931,133 B2
(45) Date of Patent: Feb. 23, 2021

(54) WIRELESS POWER RECEIVING DEVICE, WIRELESS POWER TRANSMISSION SYSTEM, AND SHORT-CIRCUIT MONITORING DEVICE

(71) Applicant: TDK CORPORATION, Tokyo (JP)

(72) Inventors: Kazunori Oshima, Tokyo (JP); Hisashi Oyama, Tokyo (JP)

(73) Assignee: TDK CORPORATION, Tokyo (JP)

( * ) Notice: Subject to any disclaimer, the term of this patent is extended or adjusted under 35 U.S.C. 154(b) by 210 days.

(21) Appl. No.: 16/030,324

(22) Filed: Jul. 9, 2018

(65) Prior Publication Data

US 2019/0013691 A1    Jan. 10, 2019

(30) Foreign Application Priority Data

Jul. 10, 2017    (JP) .............................. JP2017-134342

(51) Int. Cl.
*H02J 7/02* (2016.01)
*G01R 31/42* (2006.01)
(Continued)

(52) U.S. Cl.
CPC .............. *H02J 7/027* (2013.01); *B60L 53/12* (2019.02); *G01R 31/42* (2013.01); *G01R 31/50* (2020.01); *H02J 7/025* (2013.01); *H02J 50/12* (2016.02); *H04B 5/0037* (2013.01); *H04B 5/0081* (2013.01); *H02M 1/32* (2013.01); *H02M 7/06* (2013.01)

(58) Field of Classification Search
CPC combination set(s) only.
See application file for complete search history.

(56) References Cited

U.S. PATENT DOCUMENTS

| | | | |
|---|---|---|---|
| 2015/0207333 A1* | 7/2015 | Baarman | H02J 50/12 307/104 |
| 2015/0357813 A1* | 12/2015 | Wu | G01R 31/40 361/93.1 |

(Continued)

FOREIGN PATENT DOCUMENTS

| | | |
|---|---|---|
| JP | 2014-121137 A | 6/2014 |
| JP | 2015-80296 A | 4/2015 |

(Continued)

*Primary Examiner* — Jared Fureman
*Assistant Examiner* — Emmanuel Dominique
(74) *Attorney, Agent, or Firm* — Young Law Firm, P.C.

(57) ABSTRACT

Disclosed herein is a wireless power receiving device that wirelessly receives power transmitted from a wireless power transmitting device. The wireless power receiving device comprises: a power receiving coil that receives an AC power through a magnetic field; a power-receiving-side capacitor that constitutes a resonance circuit together with the power receiving coil; a rectifying circuit that rectifies the AC power received by the power receiving coil by a plurality of bridge-connected semiconductor devices each having a rectifying function; and a short-circuit detection circuit that detects a short circuit in the rectifying circuit based on a first AC voltage which is a voltage between a one-side input line of the rectifying circuit and a stable potential and a second AC voltage which is a voltage between the other-side input line of the rectifying circuit and the stable potential.

13 Claims, 12 Drawing Sheets

(51) Int. Cl.
*H02J 50/12* (2016.01)
*H04B 5/00* (2006.01)
*B60L 53/12* (2019.01)
*G01R 31/50* (2020.01)
H02M 7/06 (2006.01)
H02M 1/32 (2007.01)

(56) References Cited

U.S. PATENT DOCUMENTS

2017/0356950 A1\* 12/2017 Chae ...................... G01R 31/50
2018/0090995 A1\* 3/2018 Arasaki ................ B60L 53/122

FOREIGN PATENT DOCUMENTS

JP 2015080296 A 4/2015
JP 2016111819 A 6/2016

\* cited by examiner

WIRELESS POWER RECEIVING DEVICE, WIRELESS POWER TRANSMISSION SYSTEM, AND SHORT-CIRCUIT MONITORING DEVICE

BACKGROUND OF THE INVENTION

Field of the Invention

The present invention relates to a wireless power receiving device, a wireless power transmission system, and a short-circuit monitoring device.

Description of Related Art

A wireless power transmission system that wirelessly transmits power from a power transmitting coil to a power receiving coil without using a power cable is now attracting attention.

A wireless power transmission system includes a wireless power transmitting device having a power transmitting coil and a wireless power receiving device having a power receiving coil. The wireless power receiving device further includes a rectifying circuit that rectifies power that the power receiving coil receives and outputs the resultant power to a load.

In a wireless power transmission system for, e.g., vehicle charging, the load is a high-voltage battery mounted on a vehicle. If a short-circuit fault occurs in the rectifying circuit in the wireless power receiving device connected to such a load, a high battery voltage is applied to the power receiving coil, which may cause various secondary faults. Therefore, it is desired that the short-circuit fault in the rectifying circuit be detected in no time for taking necessary countermeasures.

JP 2016-111819 A discloses a technique of stopping power receiving operation when an output side power line of the rectifying circuit is in an overvoltage state. Specifically, when the overvoltage state occurs, both ends of power-receiving-side resonance circuit including the power receiving coil are short-circuited to stop power receiving operation.

JP 2015-80296 A discloses a technique of detecting an abnormality that can occur in a path between the power receiving coil and the rectifying circuit and in various elements on the path. Specifically, the path is separated from the power receiving coil and the rectifying circuit to constitute a closed loop. Then, power for abnormality determination is supplied to the closed loop to thereby allow the measurement of the value of a current flowing in the closed loop.

However, the techniques disclosed in JP 2016-111819 A and JP 2015-80296 A cannot detect the short-circuit fault in the rectifying circuit. Further, the method according to the technique disclosed in JP 2015-80296 A cannot determine the presence/absence of an abnormality during power transmission operation.

SUMMARY

The present invention has been made in view of such problems, and the object thereof is to provide a wireless power receiving device, a wireless power transmission system, and a short-circuit monitoring device capable of detecting a short-circuit fault in the rectifying circuit during power transmission operation.

A wireless power receiving device according to the present invention is a device that wirelessly receives power transmitted from a wireless power transmitting device. The wireless power receiving device includes: a power receiving coil that receives an AC power through a magnetic field; a power-receiving-side capacitor that constitutes a resonance circuit together with the power receiving coil; a rectifying circuit that rectifies the AC power received by the power receiving coil by a plurality of bridge-connected semiconductor devices each having a rectifying function; and a short-circuit detection circuit that detects a short circuit in the rectifying circuit based on a first AC voltage which is a voltage between a one-side input line of the rectifying circuit and a stable potential and a second AC voltage which is a voltage between the other-side input line of the rectifying circuit and the stable potential.

A wireless power transmission system according to the present invention includes a wireless power transmitting device and a wireless power receiving device, wherein the wireless power receiving device is any one of the above wireless power receiving devices.

A short-circuit monitoring device according to the present invention is a device that detects a short circuit in a rectifying circuit that rectifies an input AC power by a plurality of bridge-connected semiconductor devices each having a rectifying function. The short-circuit monitoring device detects the short circuit in the rectifying circuit based on a first AC voltage that is a voltage between a one-side input line of the rectifying circuit and a stable potential and a second AC voltage that is a voltage between the other-side input line of the rectifying circuit and the stable potential.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Figure 1:
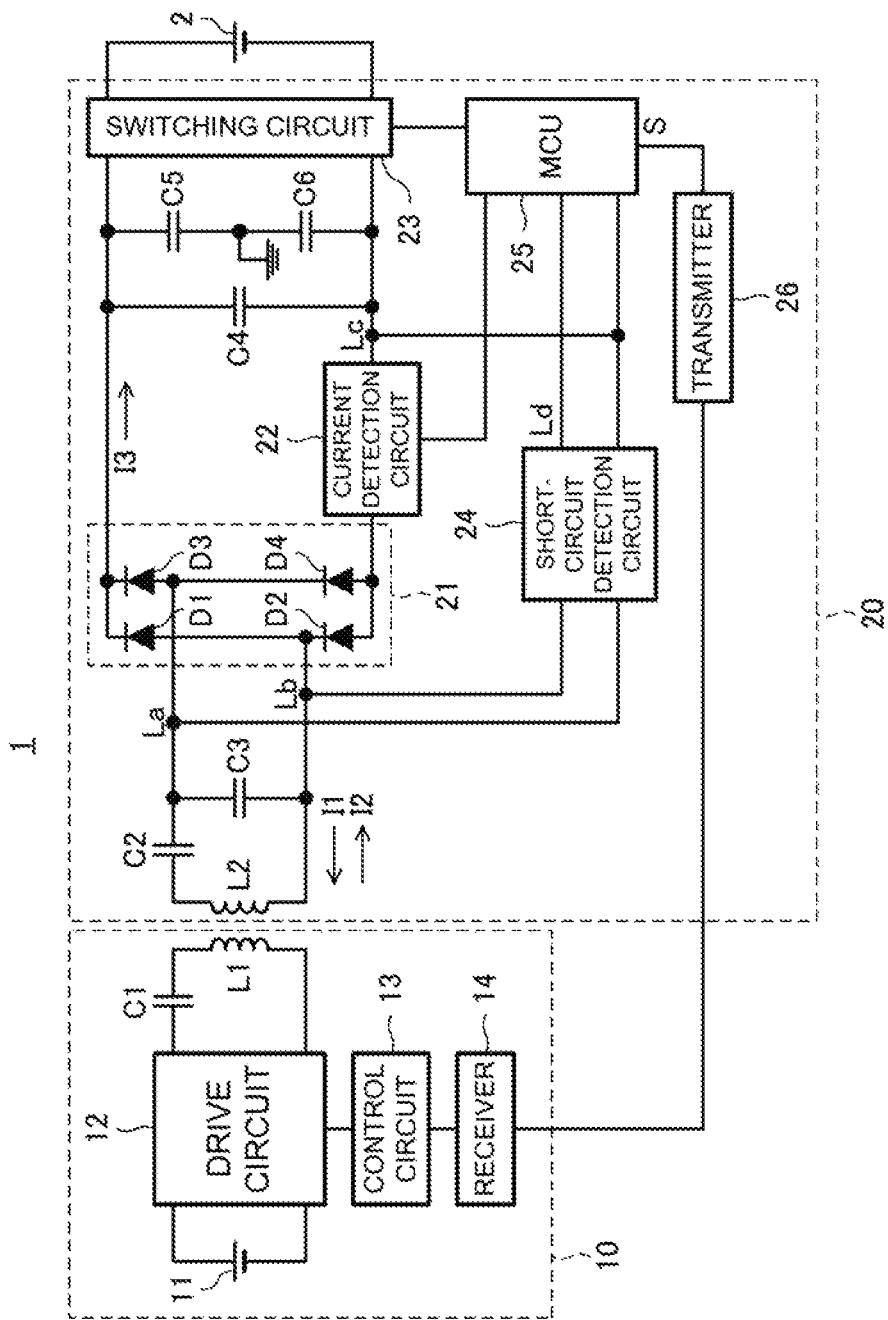
FIG. 1 is a view illustrating the configuration of a wireless power transmission system 1 according to a first embodiment of the present invention and a load 2 connected to the wireless power transmission system 1.

Hereinafter, with reference to the accompanying drawings, embodiments of the present invention will be described in detail. It should be noted that the present invention is not limited to the following embodiments. Further, the constituent elements described below include those that a person skilled in the art could readily conceive of, and those substantially identical thereto. Further, throughout the description, the same reference numerals are given to the same elements or elements having the same functions, and repeated description will be omitted.

FIG. 1 is a view illustrating the configuration of a wireless power transmission system 1 according to a first embodiment of the present invention and a load 2 connected to the wireless power transmission system 1. As illustrated in FIG. 1, the wireless power transmission system 1 includes a wireless power transmitting device 10 and a wireless power receiving device 20. The load 2 is connected to the wireless power receiving device 20.

The wireless power transmission system 1 is a system used for power transmission to, e.g., a moving body such as an electric vehicle (EV) or a hybrid vehicle (HV) that utilizes power from a secondary battery. In this case, the wireless power transmitting device 10 is mounted in a power transmission facility installed on the ground, and the wireless power receiving device 20 is mounted on a vehicle body. Hereinafter, descriptions will be made assuming that the wireless power transmission system 1 is provided for power transmission to an electric vehicle.

As illustrated in FIG. 1, the wireless power transmitting device 10 includes a DC power supply 11, a drive circuit 12, a control circuit 13, a receiver 14, a power transmitting coil L1, and a power-transmission-side capacitor C1.

The DC power supply 11 plays a role of supplying a DC power to the drive circuit 12. The DC power supply 11 is not particularly limited in type as long as it can supply a DC power. For example, a DC power supply obtained by rectifying and smoothing a commercial AC power supply, a secondary battery, a DC power supply from solar energy source, a switching power supply such as a switching converter, and the like can be suitably used as the DC power supply 11.

The drive circuit 12 is a conversion circuit that converts a DC voltage supplied from the DC power supply 11 into an AC voltage and is constituted by a switching circuit (full-bridge circuit, not illustrated) having four switching elements that are bridge-connected to each other. The drive circuit 12 plays a role of supplying an AC current to the power transmitting coil L1.

The control circuit 13 is a circuit that controls the operation of the drive circuit 12 such that the frequency of the AC current to be supplied to the power transmitting coil L1 becomes equal to a predetermined power transmission frequency fp. For example, when the drive circuit 12 is the above-mentioned full-bridge circuit, the control circuit 13 generates a control signal for each of the switching elements constituting the full-bridge circuit such that the frequency of the AC current to be supplied to the power transmitting coil L1 becomes equal to the predetermined power transmission frequency fp. A concrete value of the power transmission frequency fp is set to, e.g., 20 kHz to 200 kHz.

The receiver 14 is a communication device configured to receive an arbitrary signal from a transmitter 26 provided in the wireless power receiving device 20. Communication between the receiver 14 and the transmitter 26 may be achieved by short-range wireless communication such as Bluetooth® or wireless LAN such as Wi-Fi®. Signals that the receiver 14 receives from the transmitter 26 include a stop command signal S that an MCU 25 to be described later transmits. The stop command signal S is a signal for instructing the wireless power transmitting device 10 to stop its power transmission operation.

When receiving the stop command signal S, the receiver 14 outputs the received stop command signal S to the control circuit 13. In response to the stop command signal S received from the receiver 14, the control circuit stops the operation of the drive circuit 12. Specifically, when the drive circuit 12 is, e.g., the above-mentioned full-bridge circuit, the control circuit 13 turns OFF all the switching elements constituting the full-bridge circuit. As a result, power transmission operation is stopped, thus making it possible to prevent a secondary fault of the wireless power transmission system 1 that can occur due to a short circuit in a rectifying circuit 21.

The power transmitting coil L1 and the power-transmission-side capacitor C1 are connected in series between a one-side terminal and the other-side terminal on the output side (AC side) of the drive circuit 12 to constitute a resonance circuit. The resonance circuit has a resonance frequency having a value identical or close to that of the above-mentioned power transmission frequency fp and plays a role of generating an AC magnetic field based on the AC current supplied from the drive circuit 12. The power-transmission-side capacitor C1 and the power transmitting coil L1 may be connected in parallel between the one-side terminal and the other-side terminal on the output side of the drive circuit 12.

The power transmitting coil L1 is a spiral coil formed by a litz wire which is obtained by twisting about 2000 insulated copper wires each having a diameter of 0.1 mm and is wound in a planar shape by several turns to several tens of turns. The power transmitting coil L1 is disposed in the ground or in the vicinity of the ground surface. When the AC current is supplied from the drive circuit 12 to the power transmitting coil L1, an AC magnetic field is generated by the supplied AC current. The AC magnetic field generates an electromotive force in a power receiving coil L2 to be described later by mutual inductance between the power transmitting coil L1 and the power receiving coil L2, whereby power transmission is achieved.

As illustrated in FIG. 1, the wireless power receiving device 20 includes a power receiving coil L2, power-receiving-side capacitors C2 and C3, a rectifying circuit 21, a current detection circuit 22, bypass capacitors C4 to C6, a switching circuit 23, a short-circuit detection circuit 24, an MCU 25, and a transmitter 26.

The power receiving coil L2 and the power-receiving-side capacitor C2 are connected in series between a one-side terminal and the other-side terminal on the input side (AC side) of the rectifying circuit 21. The power-receiving-side capacitor C3 is connected in parallel with the power receiving coil L2 and the power-receiving-side capacitor C2. As a result, the power receiving coil L2 and the power-receiving-side capacitors C2 and C3 constitute a resonance circuit. The resonance frequency of the resonance circuit is also set to a value identical or close to that of the above-mentioned power transmission frequency fp. The resonance circuit plays a role as a power receiving section that receives an AC power transmitted from the power transmitting coil L1 by wireless.

Like the power transmitting coil L1, the power receiving coil L2 is a spiral coil formed by a litz wire which is obtained by twisting about 2000 insulated copper wires each having a diameter of 0.1 mm and is wound in a planar shape by several turns to several tens of turns. On the other hand, unlike the power transmitting coil L, the power receiving coil L2 is disposed, e.g., at the lower part of the vehicle body of the electric vehicle. When a magnetic flux generated by the power transmitting coil L1 interlinks the power receiving coil L2, an AC current flows in the power receiving coil L2 by electromagnetic induction. The AC current is converted into a DC current by the rectifying circuit 21 and is then supplied to the load 2. This allows a DC power to be supplied to the load 2.

The rectifying circuit 21 is a conversion circuit that converts an AC voltage supplied from the power receiving coil L2 into a DC voltage and includes four diodes D1 to D4 (a plurality of semiconductor devices each having a rectifying function) that are bridge-connected to each other as illustrated in FIG. 1. When a current in a direction denoted by the illustrated arrow I1 is induced in the power receiving coil L2, the current flows passing through the diodes D2 and D3 in the rectifying circuit 21, with the result that the current output from the rectifying circuit 21 flows in a direction denoted by the illustrated arrow 13. On the other hand, when a current in a direction (direction opposite to the direction denoted by the arrow I1) denoted by the illustrated arrow 12 is induced in the power receiving coil L2, the current flows passing through the diodes D1 and D4 in the rectifying circuit 21, with result that the current output from the rectifying circuit 21 flows in a direction denoted by the 13. That is, the direction of the output current of the rectifying circuit 21 is constant irrespective of the direction of the current induced in the power receiving coil L2. Hereinafter, a wire connected to a one-side terminal of the input side (AC side) of the rectifying circuit 21 is referred to as "one-side input line La", a wire connected to the other-side terminal of the input side (AC side) of the rectifying circuit 21 is referred to as "other-side input line Lb", a wire connected to a high-voltage-side terminal of the output side (DC side) of the rectifying circuit 21 is referred to as "high-voltage-side output line", and a wire connected to a low-voltage-side terminal of the output side (DC side) of the rectifying circuit 21 is referred to as "low-voltage-side output line Lc".

The current detection circuit 22 is a circuit that detects the output current of the rectifying circuit 21. The output of the current detection circuit 22 has different values depending on whether or not the output current of the rectifying circuit 21 flows therethrough. While, in FIG. 1, the current detection circuit 22 is inserted in the middle of the low-voltage-side output line Lc, it may be inserted in the middle of the high-voltage-side output line.

The bypass capacitors C4 to C6 are each a capacitor installed for the purpose of reducing a variation in the output voltage (DC voltage) of the rectifying circuit 21. The bypass capacitor C4 is connected between the high-voltage-side output line and the low-voltage-side output line Lc, the bypass capacitor C5 is connected between the high-voltage-side output line and a ground line, and the bypass capacitor C6 is connected between the low-voltage-side output line Lc and the ground line.

The switching circuit 23 is a circuit that switches a connection state between the high-voltage-side output line and the load 2 and a connection state between the low-voltage-side output line Lc and the load 2. The switching circuit 23 perform the switching according to control from the MCU 25.

Although not illustrated, the load 2 includes a charger and a battery. The charger is a circuit having a function of charging the battery based on the DC current output from the rectifying circuit 21. The charging is executed by, e.g., constant-voltage and constant-current charging (CVCC charging). The battery is not particularly limited in type as long as it can store an electric power. For example, a secondary battery (lithium-ion battery, lithium-polymer battery, nickel battery, etc.) and a capacitive element (electric double layer capacitor, etc.) can be suitably used as a battery constituting the load 2.

The short-circuit detection circuit 24 is a circuit that detects a short circuit in the rectifying circuit 21 based on a voltage (first AC voltage) between the one-side input line La and a stable potential and a voltage (second AC voltage) between the other-side input line Lb and the stable potential. The short circuit mentioned here refers to a short circuit in any one or more of the four diodes D1 to D4 constituting the rectifying circuit 21. Further, in the present embodiment, the potential of the low-voltage-side output line Lc is used as the stable potential. Accordingly, the value of the stable potential is the same as that of the potential of the low-voltage-side output line Lc. Details of the short-circuit detection circuit 24 will be described later.

The MCU 25 is a processor that controls the entire operation of the wireless power receiving device 20. The MCU 25 is connected to the current detection circuit 22, switching circuit 23, short-circuit detection circuit 24, and transmitter 26 and is configured to control the switching circuit 23 and generate the stop command signal S based on a detection result by the current detection circuit 22 regarding the output current of the rectifying circuit 21 and a detection result by the short-circuit detection circuit 24 regarding the short circuit in the rectifying circuit 21. Details of the MCU 25 will also be described later.

The transmitter 26 is a device for transmitting information to the power transmission side. Specifically, the transmitter 26 is configured to transfer the stop command signal S generated by the MCU 25 to the receiver 14. Operation performed in the wireless power transmitting device 10 that has received the stop command signal S is as described above.

Figure 2:
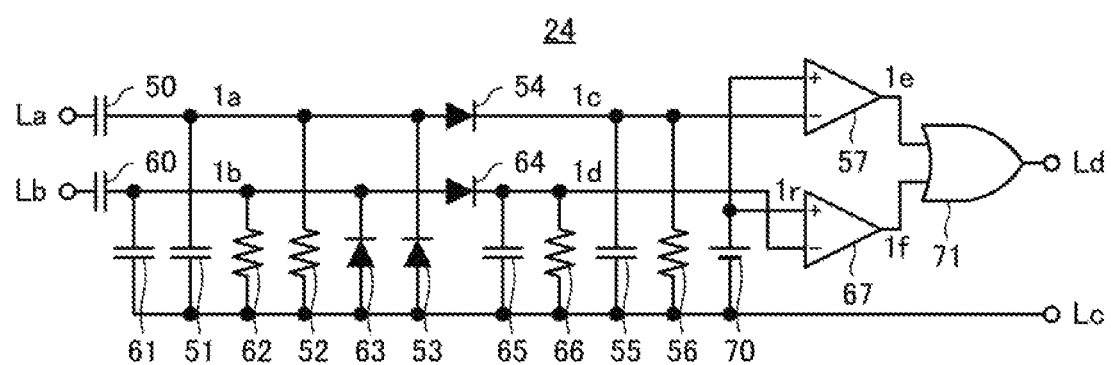
FIG. 2 is a view illustrating the internal configuration of the short-circuit detection circuit 24 illustrated in FIG. 1.
Figure 3:
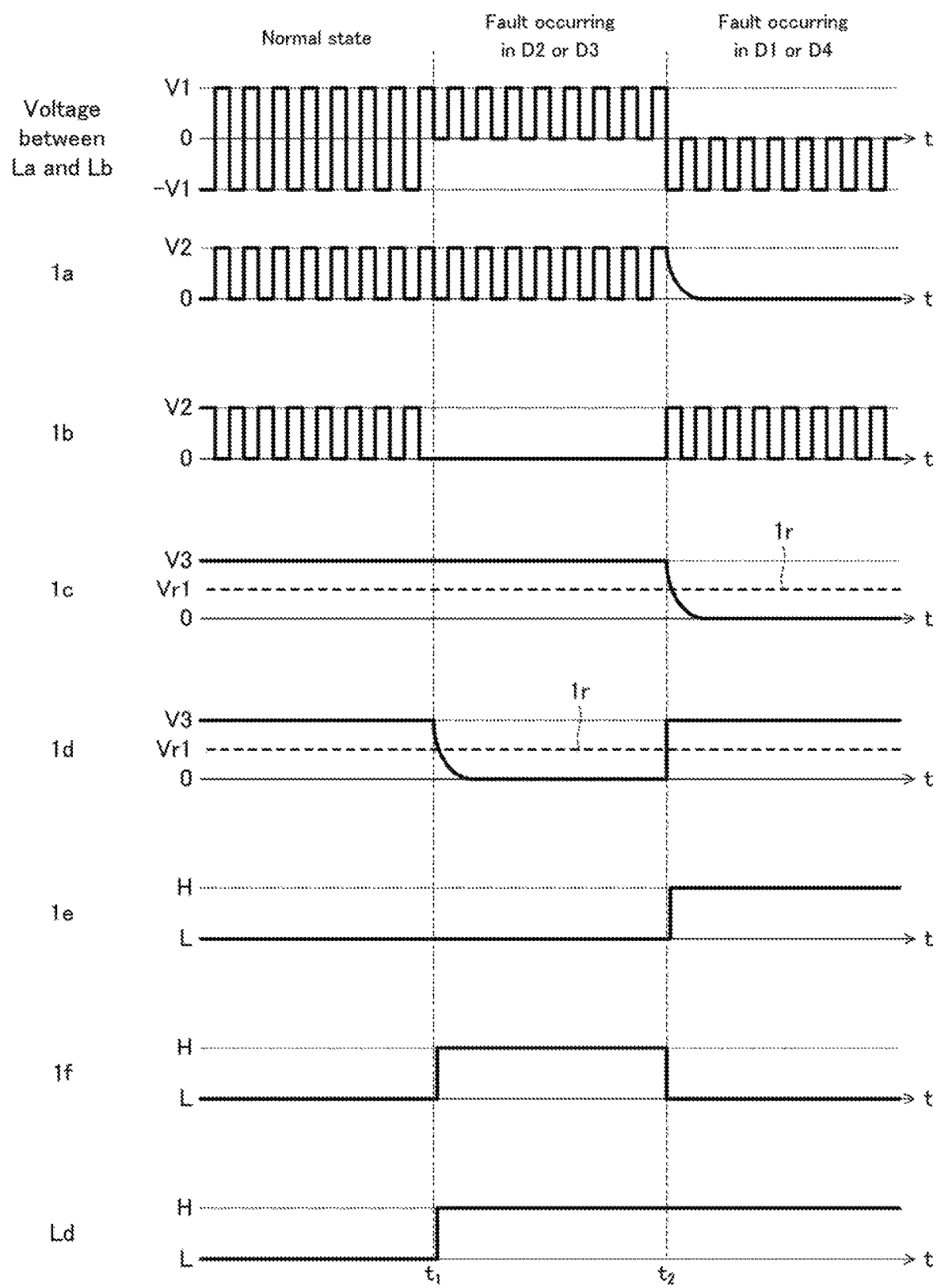
FIG. 3 is a view illustrating the temporal change of each voltage in the first embodiment of the present invention.

FIG. 2 is a view illustrating the internal configuration of the short-circuit detection circuit 24. FIG. 3 is a view illustrating the temporal change of each voltage in the present embodiment. Hereinafter, with reference to FIGS. 2 and 3 and also to FIG. 1, the configuration and operation of the short-circuit detection circuit 24 will be described in detail.

As illustrated in FIG. 2, the short-circuit detection circuit 24 includes capacitors 50, 51, 55, 60, 61, and 65, resistive elements 52, 56, 62, 66, diodes 53, 54, 63, and 64, operation amplifiers 57 and 67, a DC power supply 70, and a logical OR circuit 71.

One end of the capacitor 50 (first capacitor) is connected to the one-side input line La illustrated in FIG. 1, and the other end (hereinafter, referred to as "node $1a$") thereof is to the anode of the diode 54. The cathode (hereinafter, referred to as "node $1c$") of the diode 54 is connected to the inverted input terminal of the operation amplifier 57. One end of the capacitor 60 (second capacitor) is connected to the other-side input line Lb illustrated in FIG. 1, and the other end (hereinafter, referred to as "node $1b$") thereof is to the anode of the diode 64. The cathode (hereinafter, referred to as "node 1d") of the diode 64 is connected to the inverted input terminal of the operation amplifier 67.

The capacitor 51 (third capacitor), resistive element 52, and diode 53 are connected between the node 1a and the low-voltage-side output line Lc. The capacitor 61 (fourth capacitor), resistive element 62, and diode 63 are connected between the node 1b and the low-voltage-side output line Lc. The diodes 53 and 63 are incorporated into the circuit in such a direction that the anodes thereof are connected to the low-voltage-side output line Lc.

The capacitor 55 and resistive element 56 are connected between the node 1c and the low-voltage-side output line Lc. The capacitor 65 and the resistive element 66 are connected between the node 1d and the low-voltage-side output line Lc.

The non-inverted input terminals of the respective operation amplifiers 57 and 67 are connected to the high-voltage-side terminal (hereinafter, referred to as "node 1r") of the DC power supply 70. The low-voltage-side terminal of the DC power supply 70 is connected to the low-voltage-side output line Lc.

The logical OR circuit 71 has a one-side input terminal connected to the output terminal (hereinafter, referred to as "node 1e") of the operation amplifier 57 and the other-side input terminal connected to the output terminal (hereinafter, referred to as "node 1f") of the operation amplifier 67. The output terminal of the logical OR circuit 71 is connected to the MCU 25 illustrated in FIG. 1 through an output line Ld of the short-circuit detection circuit 24.

With the above circuit configuration, the capacitors 50 and 51 function as a capacitance voltage-dividing circuit (first capacitance voltage-dividing circuit) that performs capacitance voltage division of the voltage between the one-side input line La and the low-voltage-side output line Lc. The resistive element 52 plays a role of charging the capacitor 50. The diodes 53, 54, capacitor 55, and resistive element 56 function as a rectifying/smoothing circuit (first rectifying/smoothing circuit) that rectifies the voltage (output voltage of the first capacitance voltage-dividing circuit) of the node 1a.

Similarly, the capacitors 60 and 61 function as a capacitance voltage-dividing circuit (second capacitance voltage-dividing circuit) that performs capacitance voltage division of the voltage between the other-side input line Lb and the low-voltage-side output line Lc. The resistive element 62 plays a role of charging the capacitor 60. The diodes 63, 64, capacitor 65, and resistive element function as a rectifying/smoothing circuit (second rectifying/smoothing circuit) that rectifies the voltage (output voltage of the second capacitance voltage-dividing circuit) of the node 1b.

The operation amplifier 57 functions as a comparison circuit (first comparison circuit) that compares the voltage (output voltage of the first rectifying/smoothing circuit) of the node 1c and the voltage (reference voltage) of the node 1r, and the operation amplifier 67 functions as a comparison circuit (second comparison circuit) that compares the voltage (output voltage of the second rectifying/smoothing circuit) of the node 1d and the voltage (reference voltage) of the node 1r. The logical OR circuit 71 functions as a detection circuit that detects a short circuit in the rectifying circuit 21 based on comparison results from the operation amplifiers 57 and 67.

FIG. 3 illustrates a voltage (voltage between La and Lb) between the one-side input line La and the other-side input line Lb and voltages (hereinafter, referred to as "voltages 1a to 1f, 1r, and Ld") of the respective nodes 1a to 1f, 1r, and output line Ld illustrated in FIG. 2. The voltages 1a to 1d and 1r are voltages based on the potential of the low-voltage-side output line Lc, the voltage 1e is a voltage based on the ground potential supplied to the operation amplifier 57, the voltage 1f is a voltage based on the ground potential supplied to the operation amplifier 67, and the voltage Ld is a voltage based on the ground potential supplied to the logical OR circuit 71. The above ground potentials may have the same value as that of the potential of the low-voltage-side output line Lc.

As illustrated in FIG. 3, the voltage between La and Lb in a normal operating state becomes a substantially rectangular-wave AC voltage periodically oscillating between a voltage V1 (>0) and a voltage −V1. The substantially rectangular shape of the voltage between La and Lb is due to clamping by the rectifying circuit 21.

When a current flows in the power receiving coil L2 in a direction denoted by the arrow I1 of FIG. 1, the other-side input line Lb and the low-voltage-side output line Lc have the same potential, so that, as illustrated in FIG. 3, a voltage between 1b and Lc which is the output voltage of the second capacitance voltage-dividing circuit becomes 0. On the other hand, the potential of the one-side input line La becomes higher than that of the low-voltage-side output line Lc, so that a voltage between 1a and Lc which is the output voltage of the first capacitance voltage-dividing circuit becomes a positive value, which is hereinafter referred to as "voltage V2".

When a current flows in the power receiving coil L2 in a direction denoted by the arrow I2 of FIG. 1, the one-side input line La and the low-voltage-side output line Lc have the same potential, so that, as illustrated in FIG. 3, the voltage between 1a and Lc which is the output voltage of the first capacitance voltage-dividing circuit becomes 0. On the other hand, the potential of the other-side input line Lb becomes higher than that of the low-voltage-side output line Lc, so that the voltage between 1b and Lc which is the output voltage of the second capacitance voltage-dividing circuit becomes the voltage V2.

As a result, as illustrated in FIG. 3, the voltage 1a and voltage 1b become substantially rectangular wave AC voltages having mutually opposite phases and each oscillating between 0 and the voltage V2.

When a short-circuit fault occurs in the diode D2 or D3, the one-side input line La, the other-side input line Lb and the low-voltage-side output line Lc are short-circuited to each other when a current flows in the direction of the arrow I2. As a result, as shown in the column of "D2 or D3 fault time" of FIG. 3, the voltage between La and Lb does not fluctuate to the negative side and, thus, the voltage 1b is fixed to 0.

On the other hand, when a short-circuit fault occurs in the diode D1 or D4, the one-side input line La, the other-side input line Lb and the low-voltage-side output line Lc are short-circuited to each other when a current flows in the direction of the arrow I1. As a result, as shown in the column of "D1 or D4 fault time" of FIG. 3, the voltage between La and Lb does not fluctuate to the positive side and, thus, the voltage 1a is fixed to 0.

The voltage 1c becomes a DC voltage V3 (>0) by the rectifying/smoothing effect of the first rectifying/smoothing circuit when the voltage 1a oscillates and becomes 0 when the voltage 1a is fixed to 0. Similarly, the voltage 1d becomes the DC voltage V3 by the rectifying/smoothing effect of the second rectifying/smoothing circuit when the voltage 1b oscillates and becomes 0 when the voltage 1b is fixed to 0.

The voltage $1r$ (output voltage of the DC power supply 70) is set to a voltage Vr1 positioned between 0 and voltage V3. As a result, the voltage $1e$ which is the output voltage of the operation amplifier 57 becomes a high level when the voltage $1c$ is lower than the voltage Vr1 (that is, when a short-circuit fault occurs in the diode D1 or D4), and otherwise becomes a low level. Further, the voltage $1f$ which is the output voltage of the operation amplifier 67 becomes a high level when the voltage $1d$ is lower than the voltage Vr1 (that is, when a short-circuit fault occurs in the diode D2 or D3), and otherwise becomes a low level. Further, the voltage Ld which is the output value of the logical OR circuit 71 becomes a high level when one of the voltages $1e$ and $1f$ is at a high level, and otherwise becomes a low level.

Table 1 shows the relationship between a state of the rectifying circuit 21 and levels of the voltages $1c$ to $1f$ and Ld. The table 1 also reveals that the voltage Ld becomes a low level when the rectifying circuit 21 is in a normal state and becomes a high level when a short-circuit fault occurs in the rectifying circuit 21.

TABLE 1

| Rectifying circuit 21 | Voltage 1c | Voltage 1d | Voltage 1e | Voltage 1f | Voltage Ld |
| --- | --- | --- | --- | --- | --- |
| Normal state | V3 | V3 | L | L | L |
| Fault occurring in D2 or D3 | V3 | 0 | L | H | H |
| Fault occurring in D1 or D4 | 0 | V3 | H | L | H |

The MCU 25 refers to the level of the voltage Ld to acquire a detection result by the short-circuit detection circuit 24 regarding the short circuit in the rectifying circuit 21. Then, based on the thus acquired result of the detection of short-circuit fault and a detection result by the current detection circuit 22 regarding the output current of the rectifying circuit 21, the MCU 25 controls the switching circuit 23 and generates the stop command signal S according to the following table 2.

TABLE 2

| Voltage Ld | Output current of rectifying circuit 21 | Switching circuit 23 | Stop command signal S |
| --- | --- | --- | --- |
| L | X | Connected | Deactivated (power transmission is continued) |
| H | 1 | Disconnected | Activated (power transmission is stopped) |
| H | 0 | Connected | Deactivated (power transmission stop state is continued) |

Specifically, when the voltage Ld is a low level (that is, when a short-circuit fault does not occur in the rectifying circuit 21), the MCU 25 puts the switching circuit 23 into a connection state and deactivates the stop command signal S irrespective of (referred to as "X" in Table 2) the result of the detection of the output current of the rectifying circuit 21. As a result, power transmission to the load 2 is continued.

When the voltage Ld is a high level, and the output current of the rectifying circuit 21 is detected (referred to as "1" in Table 2) (that is, when a short-circuit fault occurs in the rectifying circuit 21), the MCU 25 puts the switching circuit 23 into a disconnection state and activates the stop command signal S. As a result, power transmission to the load 2 is stopped, and the output voltage of the load 2 is prevented from being supplied to the power receiving coil L2.

Finally, when the voltage Ld is a high level, and the output current of the rectifying circuit 21 is not detected (referred to as in Table 2), the MCU 25 puts the switching circuit 23 into a connection state and deactivates the stop command signal S. As a result, the power transmission stop state is continued. In this case, it cannot always be said that the short-circuit fault is occurring in the rectifying circuit 21, although the voltage Ld is a high level. This is because the voltage between La and Lb does not oscillate during the power transmission stop state irrespective of the state of the diodes in the rectifying circuit 21. As described above, the MCU 25 controls the switching circuit 23 and generates the stop command signal S based on not only the level of the voltage Ld, but also the detection result by the current detection circuit 22 regarding the output current of the rectifying circuit 21 and thus can perform adequate control according to a power transmission state.

As described above, with the wireless power receiving device 20 and wireless power transmission system 1 of the present embodiment, it is possible to detect the occurrence of a short-circuit fault in one or two (two diodes provided in different rectifying paths) of the bridge-connected diodes D1 to D4 during power transmission. This allows a short-circuit fault in the rectifying circuit 21 to be detected during power transmission.

Further, using the low-voltage-side output line Lc as the stable potential eliminates the need of externally supplying a dedicated stable potential, allowing the circuit configuration to be simplified.

Further, the capacitors 50 and 60 are provided at the respective input ends of the short-circuit detection circuit 24, so that surge resistance of the short-circuit detection circuit 24 is improved. The surge resistance of the short-circuit detection circuit 24 is further improved also by providing the first and second capacitance voltage-dividing circuits and first and second rectifying/smoothing circuits in the short-circuit detection circuit 24.

Further, the current detection circuit 22 for detecting the output current of the rectifying circuit 21 is provided, so that separation of the load 2 and power transmission stop control can be performed while distinguishing between a case where the first or second AC voltage does not oscillate due to the stop of power transmission and a case where it does not oscillate due to a short circuit in the rectifying circuit 21. Further, the switching circuit 23 for switching a connection state between the output end of the rectifying circuit 21 and the load 2 is used to separate the output end of the rectifying circuit 21 from the load 2 when the following two conditions are met: the short-circuit detection circuit 24 detects a short circuit in the rectifying circuit 21; and the current detection circuit 22 detects the output current of the rectifying circuit 21, whereby a secondary fault can be prevented.

The internal configuration of the short-circuit detection circuit 24 can be variously modified. Hereinafter, various modifications (first to fourth modifications) of the internal configuration of the short-circuit detection circuit 24 will be described.

Figure 4:
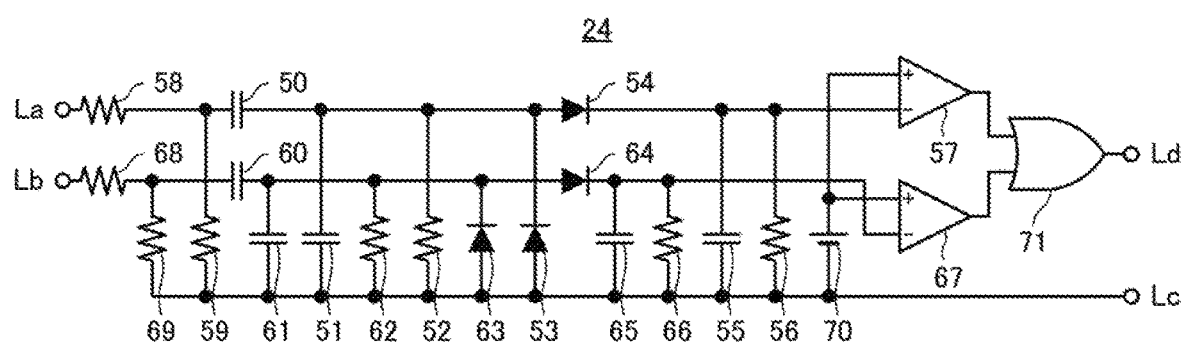
FIG. 4 is a view illustrating a first modification of the internal configuration of the short-circuit detection circuit 24 illustrated in FIG. 1.

FIG. 4 is a view illustrating a first modification of the internal configuration of the short-circuit detection circuit 24 illustrated in FIG. 1. The short-circuit detection circuit 24 according to the present modification differs from the short-circuit detection circuit 24 according to the above embodiment in that it includes a resistive element 58 between the one-side input line La and the capacitor 50, a resistive element 59 between the capacitor 50 side end portion of the resistive element 58 and the low-voltage-side output line Lc, a resistive element 68 between the other-side input line Lb and the capacitor 60, and a resistive element 69 between the capacitor 60 side end portion of the resistive element 68 and the low-voltage-side output line Lc. The resistive elements 58 and 59 constitute a resistance voltage-dividing circuit (first resistance voltage-dividing circuit) provided between the one-side input line La and the capacitor 50, and the resistive elements 68 and 69 constitute a resistance voltage-dividing circuit (second resistance voltage-dividing circuit) provided between the other-side input line Lb and the capacitor 60.

The temporal change of each voltage in the present modification is the same as that illustrated in FIG. 3 except that the voltage is reduced. Thus, the present modification can also provide the same effects as those of the above embodiment. Further, according to the present modification, the voltage input to the capacitors 50 and 60 is reduced as compared with that in the above embodiment, so that the allowable voltage of the capacitors 50 and 60 can be set low, whereby the capacitors 50 and 60 can be reduced in size.

Figure 5:
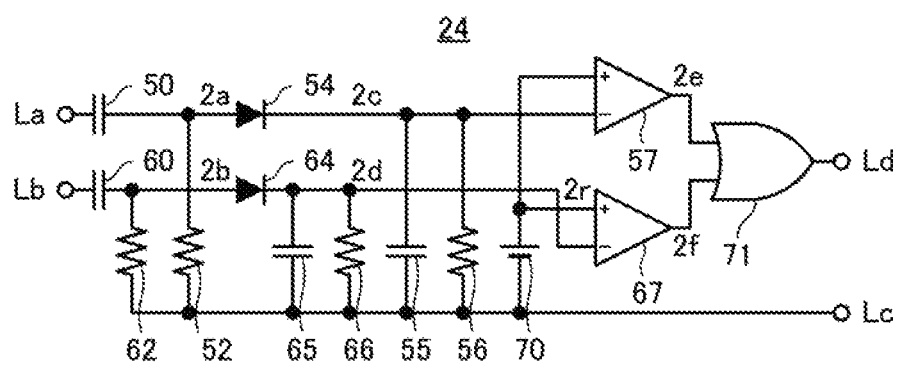
FIG. 5 is a view illustrating a second modification of the internal configuration of the short-circuit detection circuit 24 illustrated in FIG. 1.

FIG. 5 is a view illustrating a second modification of the internal configuration of the short-circuit detection circuit 24 illustrated in FIG. 1. The short-circuit detection circuit 24 according to the present modification differs from the short-circuit detection circuit 24 according to the above embodiment in that it does not include the capacitors 51 and 61 and diodes 53 and 63. In the present modification, the capacitor 50 and resistive element 52 constitute a first differentiation circuit, and the capacitor 60 and resistive element 62 constitute a second differentiation circuit.

Figure 6:
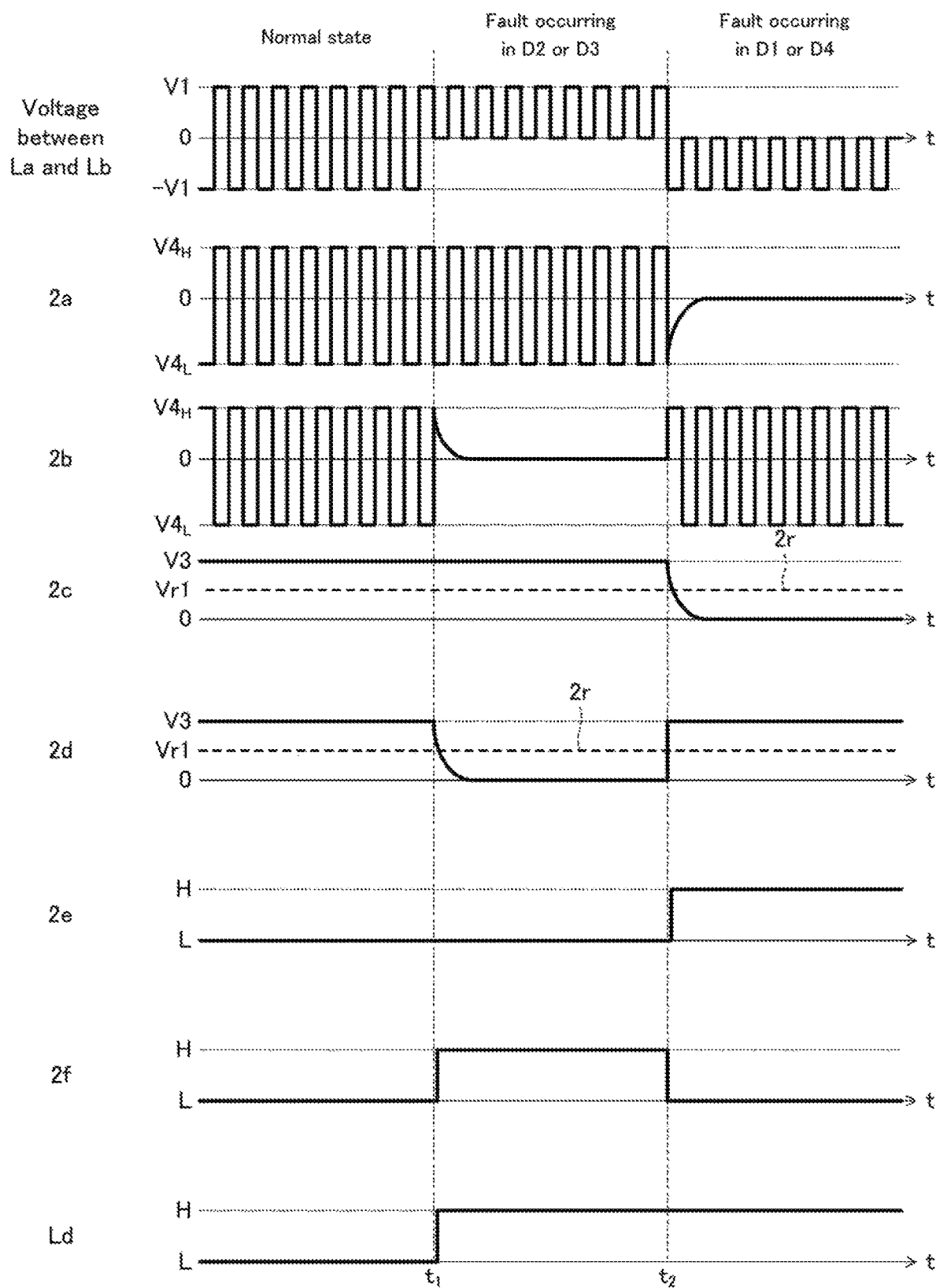
FIG. 6 is a view illustrating the temporal change of each voltage in the second modification illustrated in FIG. 5.

FIG. 6 is a view illustrating the temporal change of each voltage in the present modification. In FIG. 6, the voltage $2a$ is a voltage between the other end (node $2a$) of the capacitor 50 and the low-voltage-side output line Lc, the voltage $2b$ is a voltage between the other end (node $2b$) of the capacitor 60 and the low-voltage-side output line Lc, the voltage $2c$ is a voltage between the cathode (node $2c$) of the diode 54 and the low-voltage-side output line Lc, and the voltage $2d$ is a voltage between the cathode (node $2d$) of the diode 64 and the low-voltage-side output line Lc. The voltages $2e$ and $2f$ are the output voltages of the operation amplifiers 57 and 67, respectively, and the voltage $2r$ is the output voltage of the DC power supply 70.

As illustrated in FIG. 6, when a short-circuit fault does not occur in the diodes D1 to D4 of the rectifying circuit 21 (in a normal operating state), the voltage $2a$ and voltage $2b$ are signals having opposite phases and oscillating between a voltage $V4_L$ (<0) and a voltage $V4_H$ (>0). When a short-circuit fault occurs in any of the diodes D1 to D4, the voltages $2a$ and $2b$ change in the same manner as the voltages $1a$ and $1b$, respectively. The voltages $2c$ to $2f$ change in the same manner as the voltages $1c$ to $1f$, respectively. Like the voltage $1r$, the voltage $2r$ is set to a voltage r1 positioned between the minimum voltage 0 and the maximum voltage V3 of the voltages $2c$ and $2d$.

Table 3 shows the relationship between a state of the rectifying circuit 21 and the levels of the voltages $2c$ to $2f$ and Ld in the present modification. As shown in Table 3, also in the present modification, the voltage Ld becomes a low level when the rectifying circuit 21 is normal and becomes a high level when a short-circuit fault occurs in the rectifying circuit 21. Thus, also in the present modification, the MCU 25 refers to the level of the voltage Ld to acquire a detection result by the short-circuit detection circuit 24 regarding the short circuit in the rectifying circuit 21. Then, based on the thus acquired result of the detection of the short-circuit fault and a detection result by the current detection circuit 22 regarding the output current of the rectifying circuit 21, the MCU 25 controls the switching circuit 23 and generates the stop command signal S according to the above table 2.

TABLE 3

| Rectifying circuit 21 | Voltage 2c | Voltage 2d | Voltage 2e | Voltage 2f | Voltage Ld |
|---|---|---|---|---|---|
| Normal state | V3 | V3 | L | L | L |
| Fault occurring in D2 or D3 | V3 | 0 | L | H | H |
| Fault occurring in D1 or D4 | 0 | V3 | H | L | H |

Figure 7:
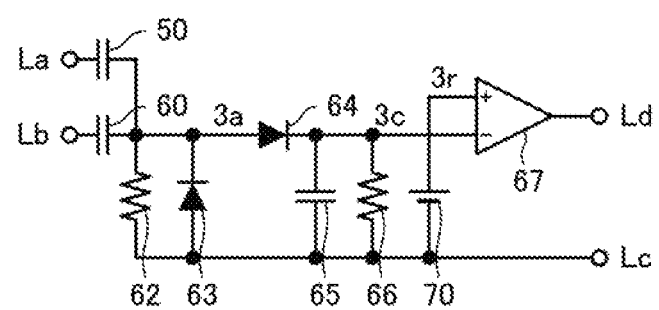
FIG. 7 is a view illustrating a third modification of the internal configuration of the short-circuit detection circuit 24 illustrated in FIG. 1.

FIG. 7 is a view illustrating a third modification of the internal configuration of the short-circuit detection circuit 24 illustrated in FIG. 1. The short-circuit detection circuit 24 according to the present modification differs from the short-circuit detection circuit 24 according to the above embodiment in the following points: the capacitors 51, 61, and 55, resistive elements 52 and 56, diodes 53 and 54, operation amplifier 57, and logical OR circuit 71 are not provided; the other end of the capacitor 50 is connected to the anode of the diode 64; and the output terminal of the operation amplifier 67 is directly connected to the MCU 25 illustrated in FIG. 1 through the output line Ld of the short-circuit detection circuit 24.

Figure 8:
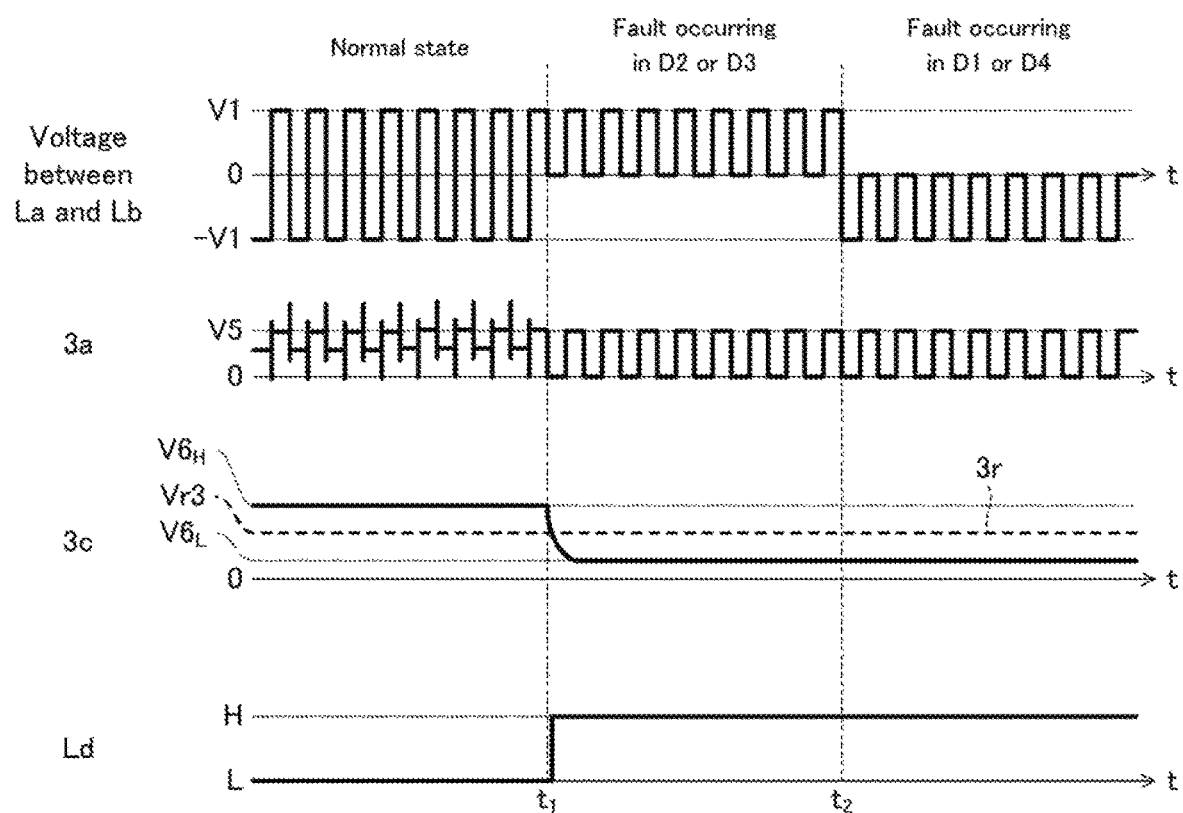
FIG. 8 is a view illustrating the temporal change of each voltage in the third modification illustrated in FIG. 7.

FIG. 8 is a view illustrating the temporal change of each voltage in the present modification. In FIG. 8, the voltage $3a$ is a voltage between the anode (node $3a$) of the diode 64 and the low-voltage-side output line Lc, and the voltage $3c$ is a voltage between the cathode (node $3c$) of the diode 54 and the low-voltage-side output line Lc. The voltage $3r$ is the output voltage of the DC power supply 70.

When a short-circuit fault does not occur in the diodes D1 to D4 (in a normal operating state), the voltage $3a$ ideally becomes 0. Actually, however, as illustrated in FIG. 8, noise of a level exceeding a voltage V5 to be describe later appears, with the result that the voltage $3c$ in a normal operating state becomes a relatively high voltage $V6_H$ (>$V6_L$). On the other hand, when a short-circuit fault occurs in any of the diodes D1 to D4, the voltage $3a$ becomes a signal oscillating between 0 and the voltage V5, with the result that the voltage $3c$ becomes a relatively low voltage $V6_L$ (>0).

The voltage $3r$ is set to a voltage Vr3 positioned between the voltage $V6_L$ and the voltage $V6_H$. As a result, the voltage Ld that is the output voltage of the operation amplifier 67 becomes a high level when the voltage $3c$ is lower than the voltage Vr3 (that is, when a short-circuit fault is occurring in any of the diodes D1 to D4), and otherwise becomes a low level.

Table 4 shows the relationship between a state of the rectifying circuit 21 and the levels of the voltages $3c$ and Ld in the present modification. As shown in Table 4, also in the present modification, the voltage Ld becomes a low level when the rectifying circuit 21 is normal and becomes a high level when a short-circuit fault occurs in the rectifying circuit 21. Thus, also in the present modification, the MCU 25 refers to the level of the voltage Ld to acquire a detection result by the short-circuit detection circuit 24 regarding the short circuit in the rectifying circuit 21. Then, based on the thus acquired result of the detection of the short-circuit fault and a detection result by the current detection circuit 22 regarding the output current of the rectifying circuit 21, the MCU 25 controls the switching circuit 23 and generates the stop command signal S according to the above table 2.

TABLE 4

| Rectifying circuit 21 | Voltage 3c | Voltage Ld |
|---|---|---|
| Normal state | $V6_H$ | L |
| Fault occurring in D2 or D3 | $V6_L$ | H |
| Fault occurring in D1 or D4 | | |

Figure 9:
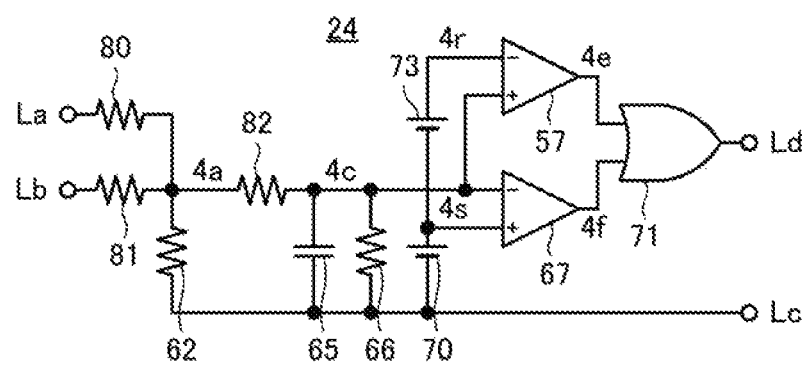
FIG. 9 is a view illustrating a fourth modification of the internal configuration of the short-circuit detection circuit 24 illustrated in FIG. 1.

FIG. 9 is a view illustrating a fourth modification of the internal configuration of the short-circuit detection circuit 24 illustrated in FIG. 1. The short-circuit detection circuit 24 according to the present modification differs from the short-circuit detection circuit 24 according to the above embodiment in the following points: the capacitors 51, 61, and 55, resistive elements 52 and 56, and diodes 53, 54, and 63 are not provided; the capacitors 50 and 60 are replaced with resistive elements 80 and 81, respectively; a DC power supply 73 is provided; the diode 64 is replaced with a resistive element 82; the other end (resistive element 62 side end portion) of the resistive element 80 is connected to one end (resistive element 62 side end portion) of the resistive element 82; the non-inverted input terminal of the operation amplifier 57 and the inverted input terminal of the operation amplifier 67 are connected in common to the other end (resistive element 66 side end portion) of the resistive element 82; the high-voltage-side terminal of the DC power supply 70 is connected to both the non-inverted input terminal of the operation amplifier 67 and the low-voltage-side terminal of the DC power supply 73; and the high-voltage-side terminal of the DC power supply 73 is connected to the inverted input terminal of the operation amplifier 57.

In the present modification, the resistive elements 80, 81, and 62 (first to third resistive elements) constitute a resistance voltage-dividing circuit that outputs the midpoint potential of the resistive elements 80, 81, and 62. The resistive element 82 and capacitor 65 constitute a filter circuit connected to this resistance voltage-dividing circuit, and the operation amplifiers 57 and 67 constitute a comparison circuit that compares the output voltage of the filter circuit and a reference voltage.

Figure 10:
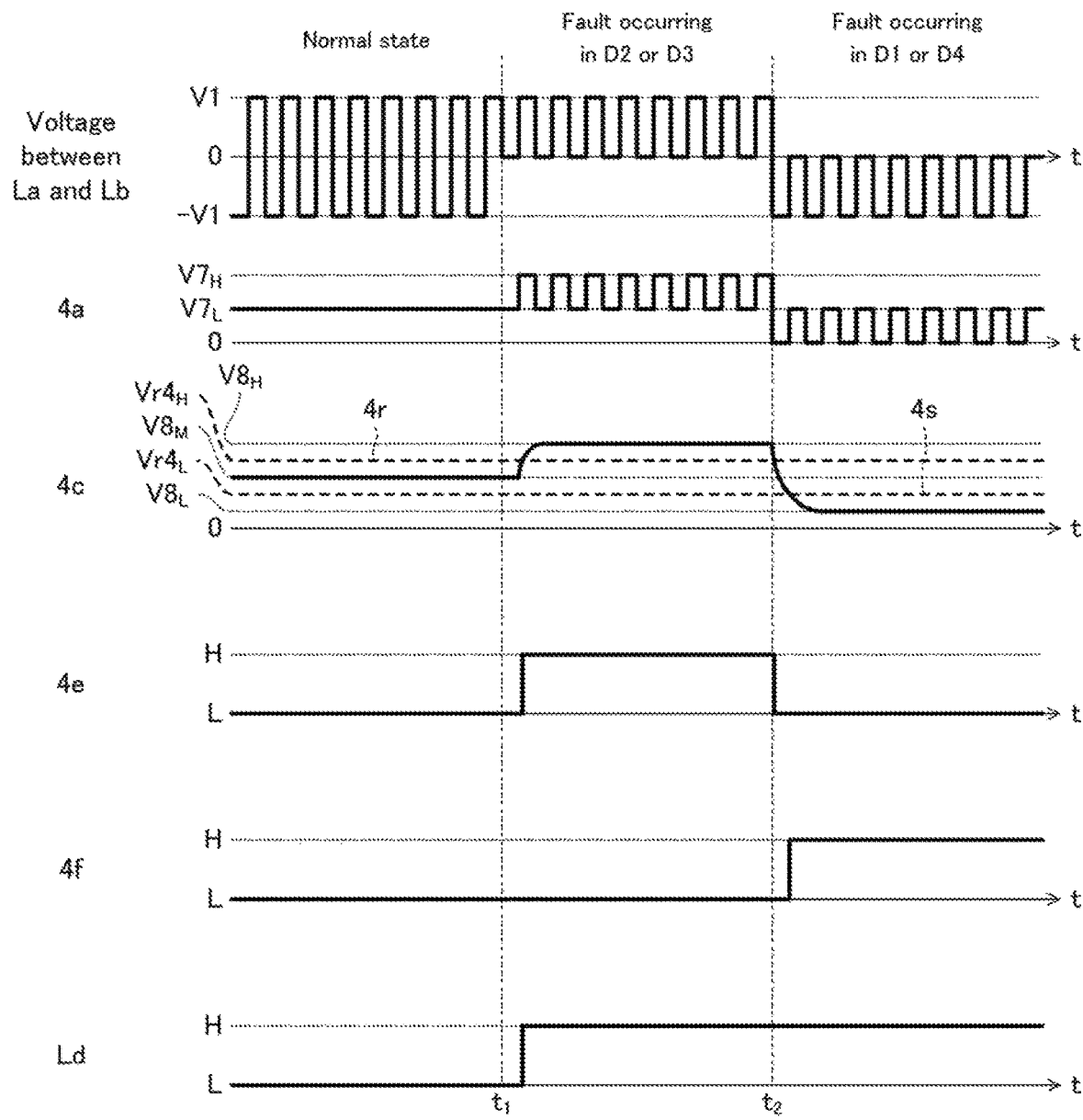
FIG. 10 is a view illustrating the temporal change of each voltage in the fourth modification illustrated in FIG. 9.

FIG. 10 is a view illustrating the temporal change of each voltage in the present modification. In FIG. 10, the voltage 4a is a voltage between one end (node 4a) of the resistive element 82 and the low-voltage-side output line Lc, and the voltage 4c is a voltage between the other end (node 4c) of the resistive element 82 and the low-voltage-side output line Lc. The voltage 4s is the input voltage of the inverted input terminal of the operation amplifier 67 (that is, output voltage of the DC power supply 70). The voltage 4r is the input voltage of the non-inverted input terminal of the operation amplifier 57 (that is, the sum of the output voltage of the DC power supply 70 and the output voltage of the DC power supply 73). The voltages 4e and 4f are the output voltages of the operation amplifiers 57 and 67, respectively.

As illustrated in FIG. 10, when a short-circuit fault does not occur in the diodes D1 to D4 of the rectifying circuit 21 (in a normal operating state), the voltage 4a becomes a relatively low voltage $V7_L$ (>0). On the other hand, when a short-circuit fault occurs in the diode D2 or D3 of the rectifying circuit 21, the voltage 4a becomes a signal oscillating between a relatively high voltage $V7_H$ (>$V7_L$) and the voltage $V7_L$. When a short-circuit fault occurs in the diode D1 or D4 of the rectifying circuit 21, the voltage 4a becomes a signal oscillating between 0 and the voltage $V7_L$.

As a result of the change in the voltage 4a, the voltage 4c becomes a relatively medium voltage $V8_M$ (>$V8_L$) when a short-circuit fault does not occur in the diodes D1 to D4 of the rectifying circuit 21 (in a normal operating state), becomes a relatively high voltage $V8_H$ (>$V8_M$) when a short-circuit fault occurs in the diode D2 or D3 of the rectifying circuit 21, and becomes a relatively low voltage $V8_L$ (>0) when a short-circuit fault occurs in the diode D1 or D4 of the rectifying circuit 21.

The voltage 4s is set to a voltage $Vr4_L$ positioned between the voltage $V8_L$ and the voltage $V8_M$. The voltage 4r is set to a voltage $VL4_H$ positioned between the voltage $V8_M$ and the voltage $V8_H$. As a result, the voltage 4e that is the output voltage of the operation amplifier 57 becomes a high level when the voltage 4c is higher than the voltage $Vr4_H$ (that is, when a short-circuit fault occurs in the diode D2 or D3), and otherwise becomes a low level. The voltage 4f that is the output voltage of the operation amplifier 67 becomes a high level when the voltage 4c is lower than the voltage $Vr4_L$ (that is, when a short-circuit fault occurs in the diode D1 or D4), and otherwise becomes a low level.

Table 5 shows the relationship between a state of the rectifying circuit 21 and the levels of the voltages 4c, 4e, 4f, and Ld in the present modification. As shown in Table 5, also in the present modification, the voltage Ld becomes a low level when the rectifying circuit 21 is normal and becomes a high level when a short-circuit fault occurs in the rectifying circuit 21. Thus, also in the present modification, the MCU 25 refers to the level of the voltage Ld to acquire a detection result by the short-circuit detection circuit 24 regarding the short circuit in the rectifying circuit 21. Then, based on the thus acquired result of the detection of the short-circuit fault and a detection result by the current detection circuit 22 regarding the output current of the rectifying circuit 21, the MCU 25 controls the switching circuit 23 and generates the stop command signal S according to the above table 2.

TABLE 5

| Rectifying circuit 21 | Voltage 4c | Voltage 4e | Voltage 4f | Voltage Ld |
|---|---|---|---|---|
| Normal state | $V8_M$ | L | L | L |
| Fault occurring in D2 or D3 | $V8_H$ | H | L | H |
| Fault occurring in D1 or D4 | $V8_L$ | L | H | H |

As described above, there are various modifications of the internal configuration of the short-circuit detection circuit 24, and in any of the above modifications, it is possible to detect the occurrence of a short-circuit fault in any of the bridge-connected diodes D1 to D4.

Figure 11:
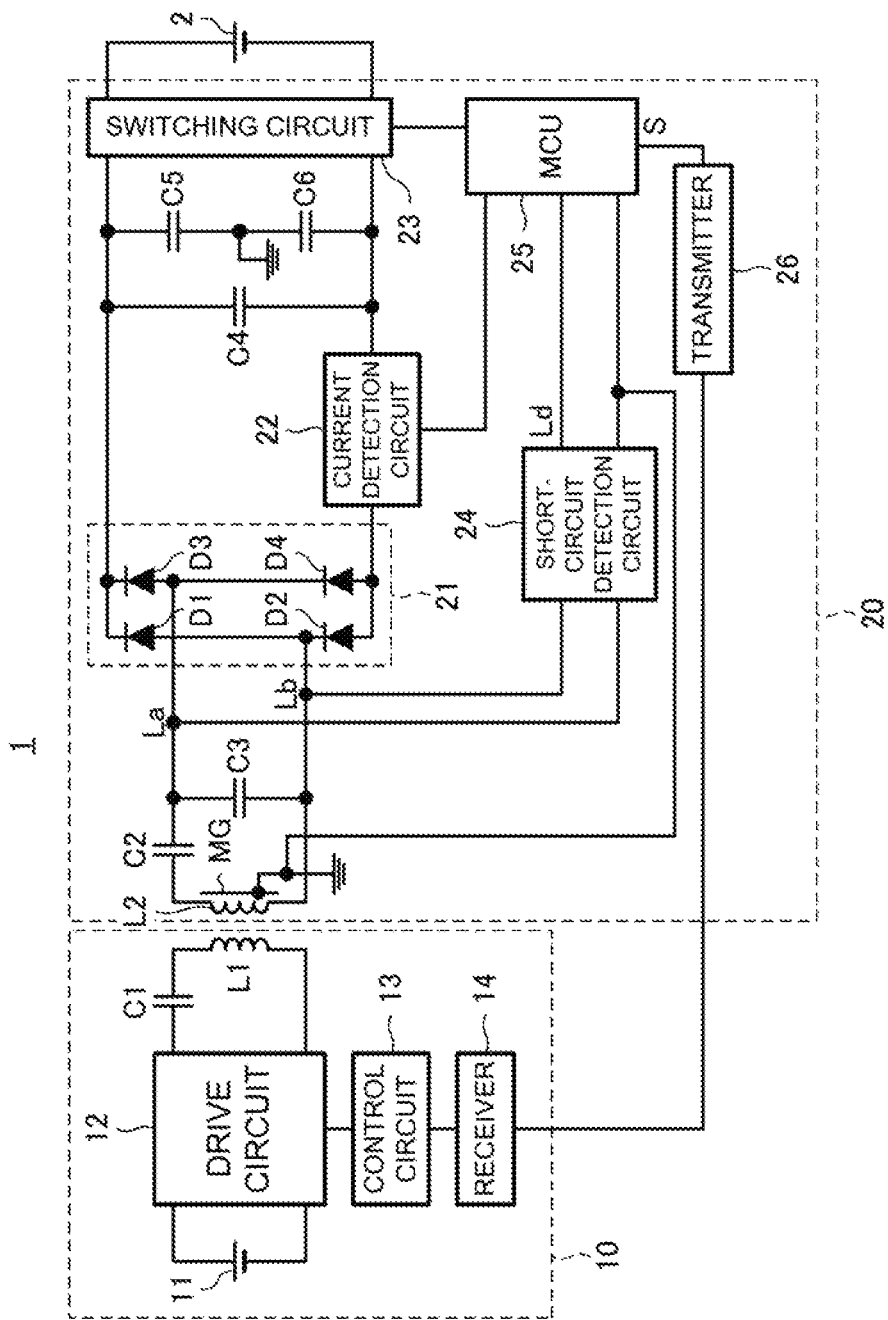
FIG. 11 is a view illustrating the configuration of the wireless power transmission system 1 according to a second embodiment of the present invention and the load 2 connected to the wireless power transmission system 1.

FIG. 11 is a view illustrating the configuration of the wireless power transmission system 1 according to a second embodiment of the present invention and the load 2 connected to the wireless power transmission system 1. The wireless power transmission system 1 according to the present embodiment differs from the wireless power transmission system 1 according to the first embodiment in that the stable potential to be supplied to the short-circuit detection circuit 24 is acquired not from the low-voltage-side output line Lc but from a metal member MG provided in the vicinity of the power receiving coil L2. Other configurations are the same as those of the wireless power transmission system 1 according to the first embodiment, so the same reference numerals are given to the same components as in the first embodiment, and the following descriptions are focusing on the differences.

The metal member MG is provided for shielding a magnetic flux and is, e.g., a metal shield plate. As illustrated in FIG. 11, the metal member MG is grounded and, thus, a ground potential is supplied to the short-circuit detection circuit 24 as the stable potential.

In the present embodiment, as in the first embodiment, it is possible to detect a short-circuit fault in the rectifying circuit 21 during power transmission. In addition, in the present embodiment, the ground potential to be supplied to the metal member MG is utilized as the stable potential, so that there is no need to externally supply a dedicated stable potential, allowing the circuit configuration to be simplified.

Figure 12:
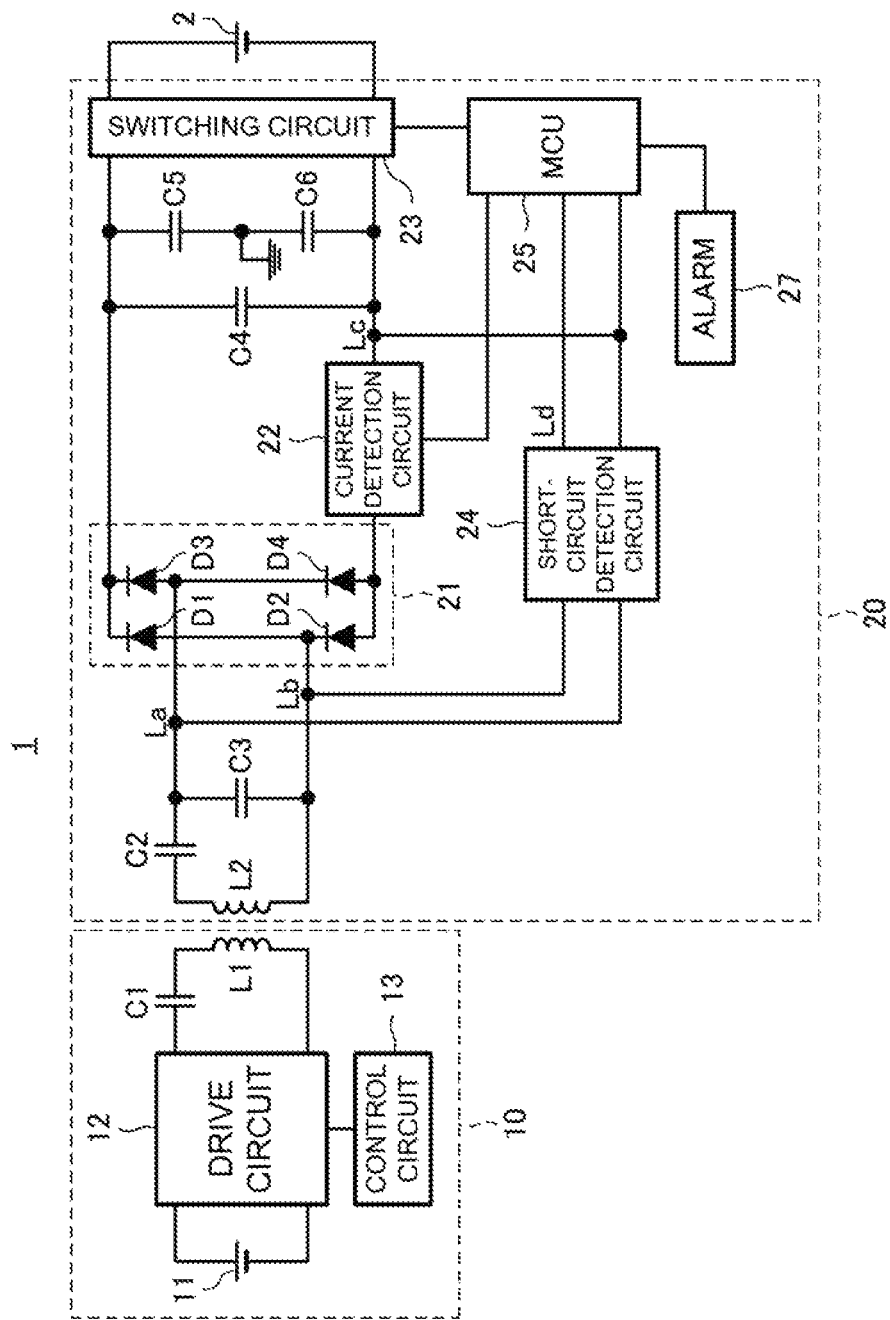
FIG. 12 is a view illustrating the configuration of the wireless power transmission system 1 according to a third embodiment of the present invention and the load 2 connected to the wireless power transmission system 1.

FIG. 12 is a view illustrating the configuration of the wireless power transmission system 1 according to a third embodiment of the present invention and the load 2 connected to the wireless power transmission system 1. The wireless power transmission system 1 according to the present embodiment differs from the wireless power transmission system 1 according to the first embodiment in that it does not include the transmitter 26 and the receiver 14 but, instead, includes an alarm 27 in the wireless power receiving device 20. Other configurations are the same as those of the wireless power transmission system 1 according to the first embodiment, so the same reference numerals are given to the same components as in the first embodiment, and the following descriptions are focusing on the differences.

The alarm 27 is a device that makes a notification to a user or an external device in response to the detection of a short circuit in the rectifying circuit 21 by the short-circuit detection circuit 24. Concrete examples of devices for making a notification to a user include, e.g., a bell that notifies the user by alarm sound that a short circuit has been detected, and a lamp that notifies the user by light that a short circuit has been detected. Examples of external devices as a target of notification by the alarm 27 include, e.g., various systems (including the charger as the above-mentioned load 2) in the vehicle body.

In the present embodiment, as in the first embodiment, it is possible to detect a short-circuit fault in the rectifying circuit 21 during power transmission. In addition, in the present embodiment, since the short circuit in the rectifying circuit 21 is notified to a user or an external device, it is possible to prompt the user to make repairs.

It is apparent that the present invention is not limited to the above embodiments, but may be modified and changed without departing from the scope and spirit of the invention.

For example, the present invention is used for detecting a short-circuit fault in the rectifying circuit 21 provided in the wireless power receiving device 20 in the above embodiments; however, the present invention can be widely applied to a short-circuit monitoring device for detecting a short circuit in a rectifying circuit that rectifies an input AC power by a plurality of bridge-connected semiconductor devices each having a rectifying function. In this case, the short-circuit monitoring device may be configured to detect the short circuit in the rectifying circuit based on a first AC voltage that is a voltage between a one-side input line of the rectifying circuit and a stable potential and a second AC voltage that is a voltage between the other-side input line of the rectifying circuit and the stable potential.

Further, in the above embodiments, the current detection circuit 22 is used for the notification of information on whether or not the wireless power transmission system 1 is in a power transmission state to the MCU 25; however, when the MCU 25 previously retains information indicating an operating state of the system, the MCU 25 itself may determine whether or not the wireless power transmission system 1 is in a power transmission state based on the retained information.

Further, the switching circuit 23 used in the above embodiments may be omitted. In this case, the system may be configured to perform power transmission stop control by activating the stop command signal S when the short circuit in the rectifying circuit 21 is detected, or to notify the occurrence of the short circuit of a user or an external device by the alarm 27.

As described above, the wireless power receiving device according to the present embodiment is a device that wirelessly receives power transmitted from a wireless power transmitting device. The wireless power receiving device includes: a power receiving coil that receives an AC power through a magnetic field; a power-receiving-side capacitor that constitutes a resonance circuit together with the power receiving coil; a rectifying circuit that rectifies the AC power received by the power receiving coil by a plurality of bridge-connected semiconductor devices each having a rectifying function; and a short-circuit detection circuit that detects a short circuit in the rectifying circuit based on a first AC voltage which is a voltage between a one-side input line of the rectifying circuit and a stable potential and a second AC voltage which is a voltage between the other-side input line of the rectifying circuit and the stable potential.

According to the present embodiment, it is possible to detect the occurrence of a short-circuit fault in one of the plurality of bridge-connected semiconductor devices during power transmission. This allows detection of a short-circuit fault in the rectifying circuit during power transmission.

In the above wireless power receiving device, the value of the stable potential may be the same as that of a low-voltage-side output line of the rectifying circuit. Alternatively, the value of the stable potential may be the same as that of a metal member additionally provided in the vicinity of the power receiving coil in an electrically grounded state. With this configuration, the circuit configuration can be simplified.

In the above wireless power receiving devices, the short-circuit detection circuit may include a first capacitor connected to the one-side input line and a second capacitor connected to the other-side input line. With this configuration, surge resistance of the short-circuit detection circuit is improved.

In the above wireless power receiving device, the short-circuit detection circuit may include a first resistance voltage-dividing circuit provided between the one-side input line and the first capacitor and a second resistance voltage-dividing circuit provided between the other-side input line and the second capacitor. With this configuration, allowable voltage of the first and second capacitors can be set low, whereby the first and second capacitors can be reduced in size.

In the above wireless power receiving devices, the short-circuit detection device may include: a third capacitor that constitutes, together with the first capacitor, a first capacitance voltage-dividing circuit that performs capacitance voltage division of the first AC voltage; a first rectifying/smoothing circuit that rectifies the output voltage of the first capacitance voltage-dividing circuit; a first comparison circuit that compares the output voltage of the first rectifying/smoothing circuit and a reference voltage; a fourth capacitor that constitutes, together with the second capacitor, a second capacitance voltage-dividing circuit that performs capacitance voltage division of the second AC voltage; a second rectifying/smoothing circuit that rectifies the output voltage of the second capacitance voltage-dividing circuit; a second comparison circuit that compares the output voltage of the second rectifying/smoothing circuit and a reference voltage; and a detection circuit that detects a short circuit in the rectifying circuit based on a comparison result by the first comparison circuit and a comparison result by the second comparison result. With this configuration, it is possible to detect the occurrence of a short-circuit fault in two (two semiconductor devices provided in different rectifying paths) of the plurality of bridge-connected semiconductor devices during power transmission. Further, surge resistance of the short-circuit detection circuit is further improved.

The above wireless power receiving device may further include a current detection circuit that detects the output current of the rectifying circuit. With this configuration, it is possible to distinguish between a case where the first or second AC voltage does not oscillate due to the stop of power transmission and a case where it does not oscillate due to a short circuit in the rectifying circuit.

The above wireless power receiving device may further include a switching circuit that switches a connection state between the output end of the rectifying circuit and a load. The switching circuit may separate the output end of the rectifying circuit from the load when the following two conditions are met: the detection circuit detects a short circuit in the rectifying circuit; and the current detection circuit detects the output current of the rectifying circuit. With this configuration, a secondary fault can be prevented because the output end of the rectifying circuit from the load is separated when the detection circuit detects a short circuit in the rectifying circuit and the current detection circuit detects the output current of the rectifying circuit.

In the above wireless power receiving devices, the short-circuit detection circuit may include: a resistance voltage-dividing circuit that has a first resistive element connected to the one-side input line, a second resistive element connected to the other-side input line, and a third resistive element connected to the stable potential and that outputs the midpoint potential of the first to third resistive elements; a filter circuit connected to the resistance voltage-dividing circuit; a comparison circuit that compares the output voltage of the filter circuit and a reference voltage; and a detection circuit that detects a short circuit in the rectifying circuit based on a comparison result by the comparison circuit. With this configuration, it is possible to detect the occurrence of a short circuit in any of the plurality of bridge-connected semiconductor devices. Further, since the resistance voltage-dividing circuit outputs the midpoint potential of the first to third resistive elements, the number of wires can be reduced.

The above wireless power receiving devices may further include a transmitter that transmits information to the power transmission side. The transmitter may transmit a signal indicating the stop of power transmission when the short-circuit detection circuit detects a short circuit in the rectifying circuit. With this configuration, a secondary fault can be prevented.

The above wireless power receiving devices may further include an alarm that notifies a user or an external device of information indicating that the short-circuit detection circuit has detected a short circuit in the rectifying circuit. With this configuration, a secondary fault can be prevented. Further, since the user and the external device is notified of the short circuit having been detected, the user can be prompted to make repairs.

A wireless power transmission system according to the present embodiment includes a wireless power transmitting device and a wireless power receiving device, wherein the wireless power receiving device is any one of the above wireless power receiving devices.

According to the present embodiment, there can be provided a wireless power transmission system capable of detecting a short-circuit fault in the rectifying circuit during power transmission.

A short-circuit monitoring device according to the present embodiment is a device that detects a short circuit in a rectifying circuit that rectifies an input AC power by a plurality of bridge-connected semiconductor devices each having a rectifying function. The short-circuit monitoring device detects the short circuit in the rectifying circuit based on a first AC voltage that is a voltage between a one-side input line of the rectifying circuit and a stable potential and a second AC voltage that is a voltage between the other-side input line of the rectifying circuit and the stable potential.

According to the present embodiment, it is possible to detect the occurrence of a short-circuit fault in one of the plurality of bridge-connected semiconductor devices during power transmission. This allows the detection of a short circuit in the rectifying circuit during power transmission.

According to the present embodiment, it is possible to detect a short-circuit fault in the rectifying circuit during power transmission.

What is claimed is:

1. A wireless power receiving device that wirelessly receives power transmitted from a wireless power transmitting device, comprising:
    a power receiving coil that receives an AC power through a magnetic field;
    a power-receiving-side capacitor that constitutes a resonance circuit together with the power receiving coil;
    a rectifying circuit that rectifies the AC power received by the power receiving coil by a plurality of bridge-connected semiconductor devices each having a rectifying function; and
    a short-circuit detection circuit that detects a short circuit in the rectifying circuit based on a first AC voltage which is a voltage between a one-side input line of the rectifying circuit and a stable potential and a second AC voltage which is a voltage between the other-side input line of the rectifying circuit and the stable potential.

2. The wireless power receiving device as claimed in claim 1, wherein the value of the stable potential is the same as that of a low-voltage-side output line of the rectifying circuit.

3. The wireless power receiving device as claimed in claim 1, further comprising a metal member provided in the vicinity of the power receiving coil in an electrically grounded state, wherein
    the value of the stable potential is the same as that of the metal member.

4. The wireless power receiving device as claimed in claim 1, wherein the short-circuit detection circuit comprises:
    a first capacitor connected to the one-side input line; and
    a second capacitor connected to the other-side input line.

5. The wireless power receiving device as claimed in claim 4, wherein the short-circuit detection circuit comprises:
    a first resistance voltage-dividing circuit provided between the one-side input line and the first capacitor; and a second resistance voltage-dividing circuit provided between the other-side input line and the second capacitor.

6. The wireless power receiving device as claimed in claim 4, wherein the short-circuit detection device comprises:
   a third capacitor that constitutes, together with the first capacitor, a first capacitance voltage-dividing circuit that performs capacitance voltage division of the first AC voltage;
   a first rectifying/smoothing circuit that rectifies the output voltage of the first capacitance voltage-dividing circuit;
   a first comparison circuit that compares the output voltage of the first rectifying/smoothing circuit and a reference voltage;
   a fourth capacitor that constitutes, together with the second capacitor, a second capacitance voltage-dividing circuit that performs capacitance voltage division of the second AC voltage;
   a second rectifying/smoothing circuit that rectifies the output voltage of the second capacitance voltage-dividing circuit;
   a second comparison circuit that compares the output voltage of the second rectifying/smoothing circuit and a reference voltage; and
   a detection circuit that detects a short circuit in the rectifying circuit based on a comparison result by the first comparison circuit and a comparison result by the second comparison result.

7. The wireless power receiving device as claimed in claim 6, further comprising a current detection circuit that detects the output current of the rectifying circuit.

8. The wireless power receiving device as claimed in claim 7, further comprising a switching circuit that switches a connection state between the output end of the rectifying circuit and a load, wherein
   the switching circuit separates the output end of the rectifying circuit from the load when the detection circuit detects a short circuit in the rectifying circuit and the current detection circuit detects the output current of the rectifying circuit.

9. The wireless power receiving device as claimed in claim 1, wherein the short-circuit detection circuit comprises:
   a resistance voltage-dividing circuit that has a first resistive element connected to the one-side input line, a second resistive element connected to the other-side input line, and a third resistive element connected to the stable potential, the resistance voltage-dividing circuit outputting the midpoint potential of the first to third resistive elements;
   a filter circuit connected to the resistance voltage-dividing circuit;
   a comparison circuit that compares the output voltage of the filter circuit and a reference voltage; and
   a detection circuit that detects a short circuit in the rectifying circuit based on a comparison result by the comparison circuit.

10. The wireless power receiving device as claimed in claim 1, further comprising a transmitter that transmits information to the power transmission side, wherein
    the transmitter transmits a signal indicating the stop of power transmission when the short-circuit detection circuit detects a short circuit in the rectifying circuit.

11. The wireless power receiving device as claimed in claim 1, further comprising an alarm that notifies a user or an external device of information indicating that the short-circuit detection circuit has detected a short circuit in the rectifying circuit.

12. A wireless power transmission system comprising a wireless power transmitting device and a wireless power receiving device, wherein the wireless power receiving device comprises:
    a power receiving coil that receives an AC power through a magnetic field;
    a power-receiving-side capacitor that constitutes a resonance circuit together with the power receiving coil;
    a rectifying circuit that rectifies the AC power received by the power receiving coil by a plurality of bridge-connected semiconductor devices each having a rectifying function; and
    a short-circuit detection circuit that detects a short circuit in the rectifying circuit based on a first AC voltage which is a voltage between a one-side input line of the rectifying circuit and a stable potential and a second AC voltage which is a voltage between the other-side input line of the rectifying circuit and the stable potential.

13. A short-circuit monitoring device detecting a short circuit in a rectifying circuit that rectifies an input AC power by a plurality of bridge-connected semiconductor devices each having a rectifying function, wherein
    the short-circuit monitoring device detects the short circuit in the rectifying circuit based on a first AC voltage that is a voltage between a one-side input line of the rectifying circuit and a stable potential and a second AC voltage that is a voltage between the other-side input line of the rectifying circuit and the stable potential.

* * * * *